United States Patent
Wambach et al.

[11] Patent Number: 5,961,740
[45] Date of Patent: Oct. 5, 1999

[54] PLATE-SHAPED SOLAR MODULE

[75] Inventors: Karsten Wambach, Ratingen; Olaf van de Venne, Rösrath, both of Germany

[73] Assignee: Pilkington Solar International GmbH, Cologne, Germany

[21] Appl. No.: 08/824,125

[22] Filed: Mar. 26, 1997

[30] Foreign Application Priority Data

Mar. 26, 1996 [DE] Germany ................ 296 05 510 U

[51] Int. Cl.$^6$ .................................... H01L 31/00
[52] U.S. Cl. ................ 136/251; 136/256; 136/259; 52/173.3
[58] Field of Search .................. 136/251, 256, 136/259; 52/173.3

[56] References Cited

U.S. PATENT DOCUMENTS 4,097,308  6/1978  Klein et al. ............................. 136/251
5,679,176  10/1997  Tsuzuki et al. ........................ 136/251

*Primary Examiner*—Mark Chapman
*Attorney, Agent, or Firm*—Sughrue, Mion, Zinn, MacPeak & Seas, PLLC

[57] ABSTRACT

A plate-shaped solar module, particularly for use as facade element or roof element is provided with an outer pane facing the incident light, at least one inner plate arranged at a distance behind it in the direction of light incidence to create an intermediate space and a peripheral construction running around the outer pane and the inner plate for connecting them in sealing manner. Solar cells are arranged between the outer pane and the inner plate, imbedded in cast resin, compound foil/s or the like, and with a conductor system electrically connecting them. The connecting lines for electric connection with other adjacent solar modules lead into the area of the periphery and the connecting lines are attached on a lug that projects into the intermediate space and is imbedded in the cast resin or the compound foil/s. The lug is connected with an insulating bush by connecting elements that extend outside the plate construction, whereby the connecting elements are connected with, in each case, one of the connecting lines laid through the insulating bush and can be connected with corresponding connecting elements of adjacent solar modules.

12 Claims, 4 Drawing Sheets

PLATE-SHAPED SOLAR MODULE

BACKGROUND OF THE INVENTION

The invention relates to a plate-shaped solar module, particularly for use as facade element or roof element, with an outer pane facing the incident light, at least one inner plate arranged at a distance behind it in the direction of light incidence and creating a pane intermediate space, a peripheral construction running around the outer pane and the inner plate and connecting them in sealing manner, and solar cells arranged between the outer pane and the inner plate, imbedded in cast resin, compound foil/s or the like, and with a conductor system electrically connecting them, from which connecting lines for electric connection with other adjacent solar modules run into the area of the periphery.

As a rule, solar modules of this kind are assembled, with mechanical and electrical connection, into solar facade surfaces or solar roof coverings. In this regard, the electrical contact surfaces are connected by corresponding electrical connecting pieces; the mechanical connection of adjacent solar modules is to be carried out separately from this.

In the case of the solar modules described in DE-A 41 40 682, an electric contact pin system is provided in a frame surrounding the plate construction, whereby the frame is to be engaged in a frame designed complementarily in mechanical and electrical respect.

From DE-U 72 27 856, it is known, for multilayer glass panes used in motor vehicle construction, to run imbedded electrical lines, which supply antennas or alarm systems, via a lug to a connection socket or several connection sockets, which can be designed as plug and socket. The lug is imbedded in the composite layer.

A similar multilayer glass pane is known from U.S. Pat. No. 4,799,346, in which a two-pin connector situated outside the pane is connected via a lug to an electric consumer situated within the glass composite. Various arrangements of the connectors are disclosed in U.S. Pat. No. 4,029,942.

In principle, running the electrical connecting lines out via a lug would be an inexpensive alternative to the solution proposed in DE-A 41 40 682. However, the electrical connection of the different solar modules would have to be carried out by an electrician, because a clear coordination of the loose hanging electrical connecting lines cannot be left up to the construction personnel usually handling the installation of solar coverings.

SUMMARY OF THE INVENTION

The technical problem of the invention is to provide a solar module of the kind mentioned in the beginning, whose electrical connection system has a high degree of mechanical stability and is designed in such a way that the electrical connecting can be carried out absolutely faultlessly.

The invention provides that connecting lines are attached on a lug projecting into the pane intermediate space and imbedded in the cast resin or the compound foil/s and which is connected with an insulating bush extending outside the plate construction, and they are lead out of the plate construction, whereby a first connecting element is provided at one end of the insulating bush and a second connecting element is provided at the opposite end of the insulating bush, whereby the connecting elements are connected with, in each case, a connecting line laid through the insulating bush and can be connected with corresponding connecting elements of adjacent solar modules.

The invention enables construction personnel less familiar with the electrical connection of elements to also install solar technology systems, e.g. on facades or on roofs, by simply assembling the modules, using the connecting elements at the end of the bush.

The insulating bush preferably extends along an edge of the plate construction, furthermore preferably over the entire length of the edge, essentially. This design achieves two things: on the one hand, in the case of a close fit against the edge, the insulating bush cannot exert any lever action on the lug, in such a way that an unintentional destruction due to rough handling is prevented, and also the connecting elements to be connected are opposite each other and/or interlock without further measures when the modules are assembled.

In this connection, one of the connecting elements is preferably designed as jack and the other as complementary connector.

To absorb possibly occurring stresses, particularly during mounting, one can provide for the insulating bush to have an elastic section that extends at least over a part of its length and width.

According to a preferred form of construction, the lug and the insulating bush should form a common modular unit which is furthermore preferably produced by injection molding.

Another design provides for equipping the insulating bush with a diode in parallel connection to the solar cell arrangement between the connecting lines attached at the lug. With such a diode, also called a bypass diode, if there is an electrical defect within the module it is bypassed in such a way that the solar technology system can continue to operate, albeit at reduced capacity. A bypass diode is usually arranged in the electrical outlet of the module. The electrical connection of the module is simplified with the arrangement according to the invention. The insulating bush is preferably designed openable for replacement of the diode.

The electrically conductive parts of the connecting elements are preferably surrounded by an insulation that ensures protection against accidental contact, in such a way that work can be carried out with the modules equipped according to the invention without the danger of touching electrically conductive parts.

In addition, the lug may have one or more extensions that ensure a traction-resistant connection of the lug with the composite double glass; this connection is produced in particular by the extensions engaging in the cast resin layer. In this way, the valuable solar technology modules are protected from the usually irreversible damage when the connections are pulled out. Such extensions are preferably provided at the lug end facing the middle of the plate construction and extend over the greatest possible length of the edge of the lug, whereby they project from the lug in the normal direction of the plate construction. From U.S. Pat. No. 4,799,346 it is known to equip with such extensions, lugs that serve to attach the multilayer glass pane to a frame. But it has not yet been thought of to protect the electrical connections directly by such a measure.

A silicate glass pane, preferably a white glass pane, may also be used as the outer pane.

A silicate glass pane is also appropriate as the inner plate. Polyvinyl butyral (PVB), ethylene vinyl acetate (EVA) or an acrylate-based monomer mixture is used as material for imbedding the solar cells.

The invention also forms the basis for a building-block type connection system for solar module arrangements. For this, combinations of the insulating bush, the connector, the lug with extensions and the connecting lines may be provided as components for the electrical connection; there may also be a jack instead of the connector. These components may be used for connecting solar modules attached at the edge of the covering, for example.

BRIEF DESCRIPTION OF THE DRAWINGS

In the following, the invention is described in greater detail with the aid of the attached drawings. They show.

DETAILED DESCRIPTION OF THE INVENTION

Figure 1:
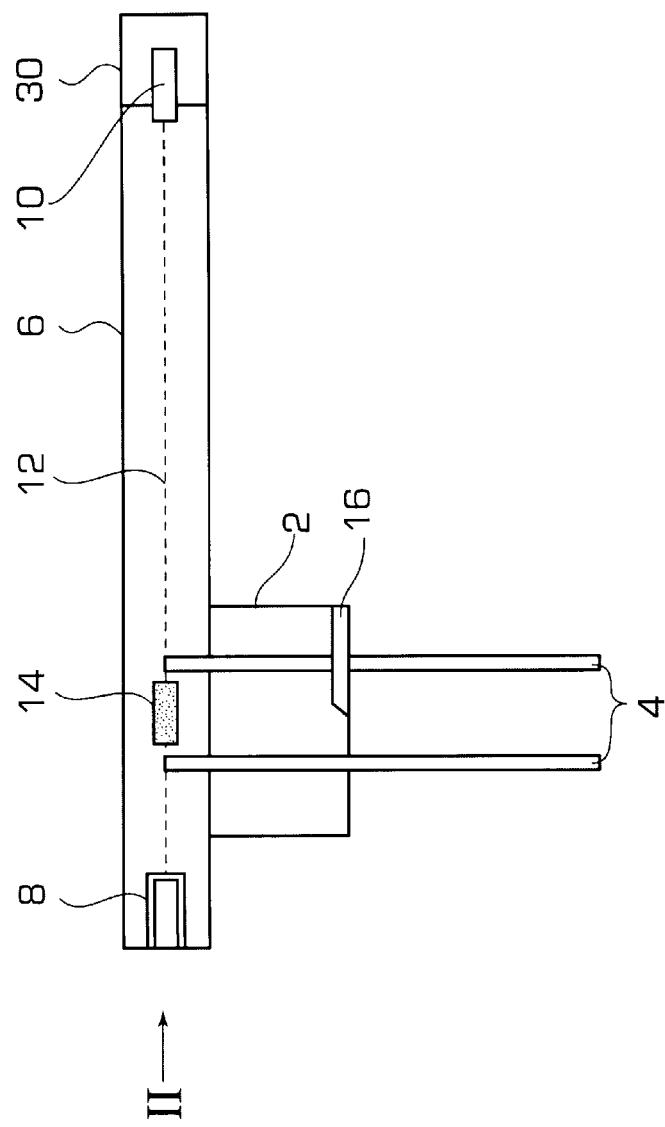
FIG. 1 a sectional view of an electrical connection system for solar modules according to the present invention, in the section direction indicated by I in FIG. 2.

As FIG. 1 shows, the electrical connection system of solar module according to the invention has a lug 2, from which connecting lines 4 project with free ends, which are electrically connected with solar cells (not shown) imbedded in cast resin or foil/s 28. The lug 2 is rigidly connected with a cylindrical hollow insulating bush 6 that extends preferably over the entire length of a module. Arranged at one end of the insulating bush 6 is a centered jack 8 and arranged at the opposite end is a connector 10 complementary to the jack and surrounded by a protection from accidental contact 10, designed as cylindrical hollow body. The electrical connecting lines 4 are run through electrical lines 12 to the connector 10 or to the jack 8.

In parallel connection to the electrical connecting lines 4, a diode 14 is inserted into the insulating bush 6 as bypass diode for the solar cell arrangement housed in the solar module. The insulating bush 6 is preferably designed openable in the area of the diode 14, for example by arranging a flap (not shown) closable by means of a screw. Diverging from the sectional view, a part of an extension 16 is shown that extends over the entire width of the lug 2.

Figure 2:
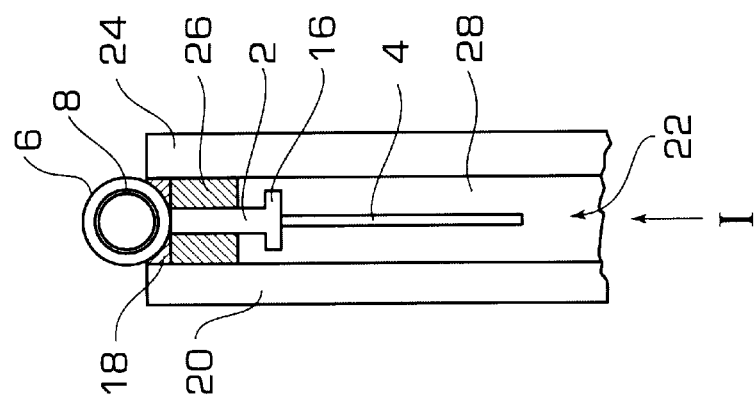
FIG. 2 shows a sectional view, partially broken off, of a solar module according to the invention, in the viewing direction indicated by II in FIG. 1.

FIG. 2 shows the connection system in a multilayer glass construction with a first glass pane 20 and a second glass pane 24 as well as a cast resin layer 28 arranged between them. The insulating bush 6 rests on the periphery of the plate construction, partly imbedded in sealing mass 18 if need be. The lug 2 is positioned by sealing tape 26 to be used in the production of solar modules anyway, and is fixed in the pane intermediate space 22 by the cast resin 28. In this form of construction, the lug 2 is provided, on its side facing away from the periphery, with two extensions 16 opposite each other. The extensions 16 may have different shapes, e.g. they may be designed hook-shaped or be provided with structured or roughened surface, in order to ensure good traction-resistance through inner contact with the surrounding cast resin mass in the pane intermediate space 22. Bonding agents may be provided to further improve the contact between the cast resin and the lug 2, and the lug 2 may also have surface structurings, similar to those of the extensions 16.

FIGS. 3 through 7 show components for a modular connection system. These components may be used for necessary special connections in addition to the connection possibilities as a result of the invention's solar module itself.

Figure 3:
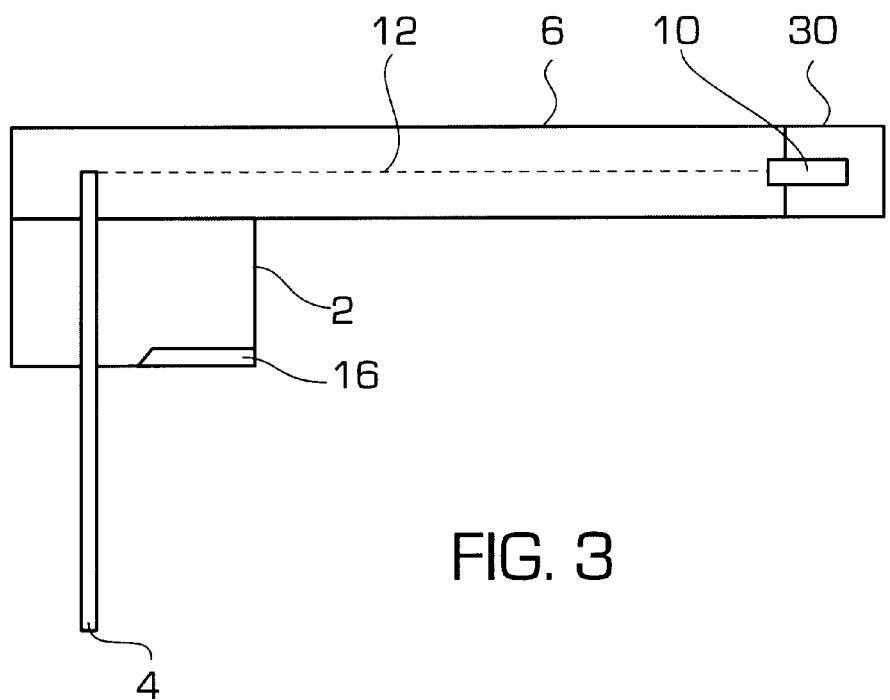
FIGS. 3 through 7 show possible components for a building-block system for use with solar modules according to the invention.

FIG. 3 shows an example of execution consisting of a lug 2 with partially shown extension 16, and which is attached on an insulating bush 6 and bears an electrical connecting line 4. An electrical line 12 is run through the insulating bush 6 and connects the connecting line 4 with the connector 10.

Figure 4:
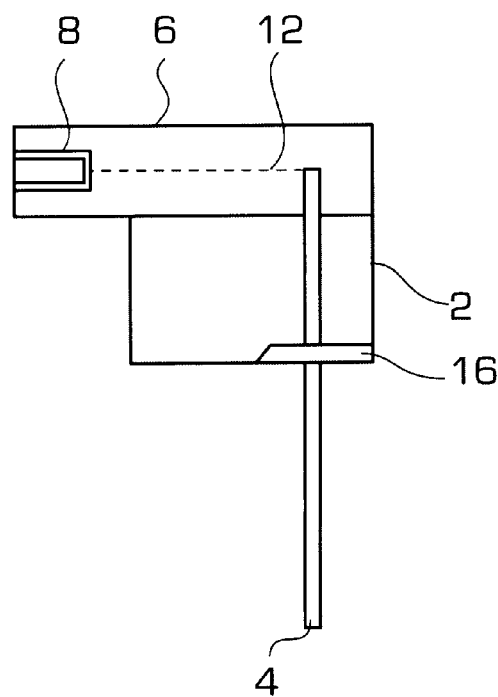

FIG. 4 shows a component complementary to FIG. 3 in the sense of FIG. 1. It consists of the same elements as the component of FIG. 3, with the exception that at the corresponding position, a jack 8 is provided instead of a connector.

Figure 5:
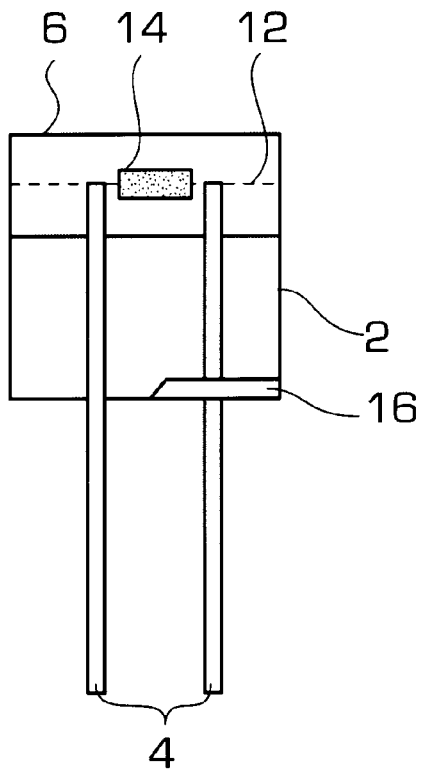

FIG. 5 shows a component with lug 2 and extension 16, in which the electrical connecting lines 4 are bypassed by a diode 14 that is arranged in the insulating bush 6. Electrical lines 12 leading away are hinted at.

Figure 6:
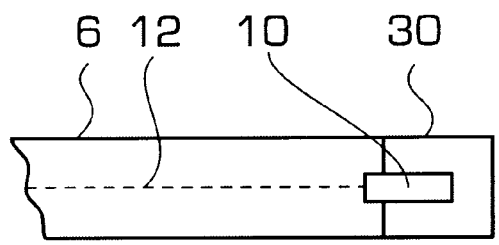
Figure 7:
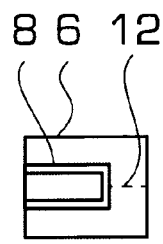

FIG. 6 shows an insulating bush 6 with connector 10 and FIG. 7 shows an insulating bush 6 with jack 8, in each case with electrical lines 12 leading away.

Figure 8:
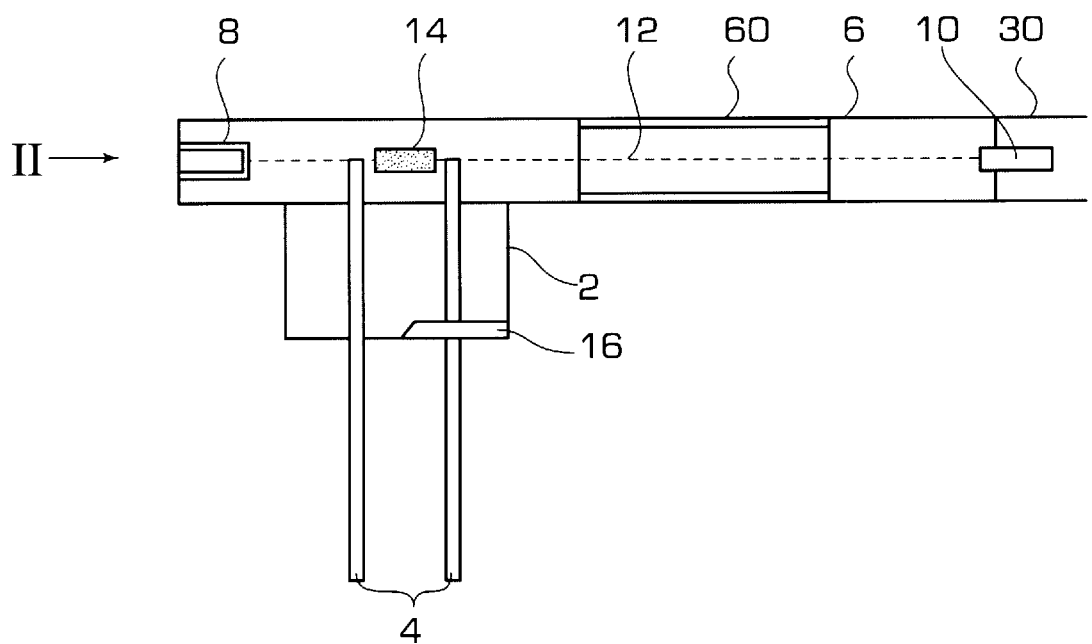
FIG. 8 an electrical connection system with an insulating bush with elastic intermediate section.

Finally, FIG. 8 shows a particular design of the construction according to FIG. 1, in which the insulating bush 6 is provided with an elastic section 60 that extends over a certain length of the insulating bush 6. This elastic section can absorb mechanical stresses that may result from temperature changes, forces introduced during mounting, etc.

The insulating bush may also be designed with square cross-section at least on part of its outer contour, in such a way that a level supporting surface is produced which, for example, can be placed onto the side of the inner plate facing away from the side of light incidence and can be attached, e.g glued there. Advisably, not only the insulating bush but also the lug is glued by means of a high-strength adhesive or an adhesive tape. The connecting lines of the solar cells are then run through an opening in the inner plate out of the pane intermediate space and soldered with the connections of the lug. The opening and the insulating bush are advantageously covered with a suitable protective cap, on which a clip at least partly enclosing the insulating bush may be provided.

The invention has been described in connection with inherently rigid plates or glass panes But composite arrangements are also known in which a foil is used as inner covering. The invention can also be used with such solar cell composites with slight modification. For this, a stiffening plate is advantageously arranged on the foil on the backside in the bearing area of the insulating bush, so as to ensure that the insulating bush can be supported in mechanically stable manner. It is also conceivable to provide, directly on the insulating bush, bearing surfaces that ensure a snug, torsion-proof, twist-proof placing of the insulating bush onto the composite. The stiffening plate may also by provided with a clip that at least partially encloses the insulating bush.

The invention's features disclosed in the preceding description, in the drawings and in the claims may individually and in any desired combination, be intrinsic to the realization of the invention.

What is claimed is:

1. A plate-shaped solar module comprises an outer pane facing the incident light, at least one inner plate arranged at a distance behind it in the direction of light incidence and creating a pane intermediate space, a peripheral construction running around the outer pane and the inner plate and connecting them in sealing manner, and solar cells arranged between the outer pane and the inner plate, imbedded in cast resin or a compound foil, and with a conductor system electrically connecting them, from which connecting lines for electric connection with other adjacent solar modules lead into the area of the periphery, characterized in that connecting lines (4) are attached on a lug (2) projecting into the pane intermediate space (22) through the peripheral construction and imbedded in the cast resin or compound foil and which is connected with an insulating bush (6) extending outside the peripheral construction and are led out of the peripheral construction, whereby a first connecting element (8) is provided at one end of the insulating bush (6) and a second connecting element (100 is provided at the opposite end of the insulating bush (6), whereby the connecting elements are connected with, in each case, a connecting line (4; 12) laid through the insulating bush (6) and can be connected with corresponding connecting elements of adjacent solar modules, wherein the insulating bush (6) extends along an edge of the peripheral construction and wherein the lug (2) and the insulating bush (6) form a common modular unit.

2. Solar module according to claim 1, characterized in that the insulating bush (6) extends essentially over the entire length of the edge.

3. Solar module according to claim 1, characterized in that one of the connecting elements is designed as jack (8) and the other as complementary connector (10).

4. Solar module according to claim 1, characterized in that the insulating bush (6) has an elastic section (60) that extends at least over a part of the length of the insulating bush (6).

5. Solar module according to claim 1, characterized in that the common modular unit is produced by injection molding.

6. Solar module according to claim 1, characterized in that a diode (14), which is laid between the connecting lines (4) in parallel connection to the solar cell arrangement, is arranged inside the insulating bush (6).

7. Solar module according to claim 1, characterized in that the insulating bush (6) is designed at least partially openable.

8. Solar module according to claim 1, characterized in that an insulating protection (30) against accidental contact is provided on the connecting elements (8, 10).

9. Solar module according to claim 1, characterized in that the lug (2) has at least one extension (16) that extends into the pane intermediate space (22).

10. Solar module according to claim 1, characterized in that a silicate glass pane, preferably of white glass, is used as the outer pane.

11. Solar module according to claim 1, characterized in that a silicate glass pane is used as the inner plate.

12. Solar module according to claim 1, characterized in that polyvinyl butyral (PVB), ethylene vinyl acetate (EVA) or an acrylate-based monomer mixture is used as material for imbedding the solar cells.

* * * * *